United States Patent
Xie et al.

(10) Patent No.: US 9,685,384 B1
(45) Date of Patent: Jun. 20, 2017

(54) DEVICES AND METHODS OF FORMING EPI FOR AGGRESSIVE GATE PITCH

(71) Applicant: GLOBALFOUNDRIES Inc., Grand Cayman (KY)

(72) Inventors: Ruilong Xie, Schenectady, NY (US); Christopher Prindle, Poughkeepsie, NY (US); Soon-Cheon Seo, Glenmont, NY (US); Balasubramanian Pranatharthiharan, Watervliet, NY (US); Pietro Montanini, Guilderland, NY (US); Shogo Mochizuki, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/210,012

(22) Filed: Jul. 14, 2016

(51) Int. Cl.
*H01L 21/70* (2006.01)
*H01L 21/8238* (2006.01)
*H01L 27/092* (2006.01)
*H01L 29/66* (2006.01)
*H01L 21/306* (2006.01)
*H01L 21/308* (2006.01)

(52) U.S. Cl.
CPC .. *H01L 21/823821* (2013.01); *H01L 21/3085* (2013.01); *H01L 21/30604* (2013.01); *H01L 21/823878* (2013.01); *H01L 29/6656* (2013.01); *H01L 29/66795* (2013.01)

(58) Field of Classification Search
CPC ....... H01L 21/823821; H01L 29/66795; H01L 21/823878; H01L 21/30604; H01L 21/3085; H01L 29/6656; H01L 29/66545; H01L 21/76897; H01L 29/41783; H01L 29/7848; H01L 29/66636; H01L 21/76224; H01L 21/823418; H01L 21/823431
USPC .... 438/294, 478, 424; 257/E21.09, E21.409, 257/E21.546
See application file for complete search history.

(56) References Cited

U.S. PATENT DOCUMENTS

| | | | |
|---|---|---|---|
| 8,445,334 B1 * | 5/2013 | Basker | H01L 29/6656 257/E21.415 |
| 9,385,189 B1 * | 7/2016 | Sung | H01L 29/0638 |
| 9,418,897 B1 * | 8/2016 | Ching | H01L 29/66795 |
| 2011/0201164 A1 * | 8/2011 | Chung | H01L 21/82380 438/229 |

(Continued)

*Primary Examiner* — Thomas L Dickey
*Assistant Examiner* — Changhyun Yi
(74) *Attorney, Agent, or Firm* — Heslin Rothenberg Farley & Mesiti P.C.; Nathan B. Davis

(57) ABSTRACT

Devices and methods of fabricating integrated circuit devices for forming epi for aggressive gate pitch are provided. One method includes: obtaining an intermediate semiconductor device having a substrate, a fin structure, a plurality of stacks; etching the spacer between the plurality of stacks; growing, epitaxially, undoped silicon on a top surface of the fin structure between the plurality of stacks; depositing a liner over the undoped silicon and the plurality of stacks; etching to remove the liner and narrow the spacers, wherein the etching forms a wider portion of the spacer at the base of the stacks; etching between the plurality of stacks to remove the undoped silicon and form recesses in the fin structure; and growing, epitaxially, doped silicon between the plurality of stacks and in the fin structure. Also disclosed is an intermediate device formed by the method.

13 Claims, 21 Drawing Sheets

(56) References Cited

U.S. PATENT DOCUMENTS

2016/0049489 A1\* 2/2016 Wan ................ H01L 29/42392
257/347

\* cited by examiner

DEVICES AND METHODS OF FORMING EPI FOR AGGRESSIVE GATE PITCH

FIELD OF THE INVENTION

The present invention relates to semiconductor devices and methods of fabricating semiconductor devices, and more particularly, to devices and methods of forming source and drain epitaxy for an aggressive gate pitch.

BACKGROUND OF THE INVENTION

For 7 nm and beyond nodes, with the continually increasing demand for smaller circuit structures and faster device performance, the need for equal spacers results in fin damage. For instance, in order to form equal spacer, an aggressive spacer reactive ion etch (RIE) process is required in order to clean up and even out the spacer material between the fins. This process frequently results in damage to the fins, such as unintentional fin erosion in the source/drain regions. The eroded area can be pinched-off by any of the additional materials used in source/drain formation, such as further patterning, addition of a liner, and other material residue. This can cause blockage of epi growth and failure of the device.

Therefore, it may be desirable to develop methods of fabricating source/drain regions of fins with equal spacers that repair fin erosion previously produced and that reduce downstream issues.

BRIEF SUMMARY

The shortcomings of the prior art are overcome and additional advantages are provided through the provisions, in one aspect, a method that includes, for instance: obtaining an intermediate semiconductor device having a substrate, a fin structure, a plurality of stacks, and a spacer deposited over the fin structure and the stacks, the stacks including a layer of amorphous silicon and a hardmask; etching the spacer between the plurality of stacks; growing, epitaxially, undoped silicon on a top surface of the fin structure between the plurality of stacks; depositing a liner over the undoped silicon and the plurality of stacks; etching to remove the liner and narrow the spacers, wherein the etching forms a wider portion of the spacer at the base of the stacks than the top of the stacks; etching between the plurality of stacks to remove the undoped silicon and form recesses in the fin structure; and growing, epitaxially, doped silicon or doped silicon germanium between the plurality of stacks and in the fin structure.

In another aspect, a method includes, for instance: obtaining an intermediate semiconductor device having a substrate, an NFET fin structure having a plurality of NFET stacks, and a spacer deposited over the fin structure and the NFET stacks, the NFET stacks including a layer of amorphous silicon, a nitride hardmask, and an oxide hardmask; and a PFET fin structure having a plurality of PFET stacks, and a spacer deposited over the fin structure and the PFET stacks, the PFET stacks including a layer of amorphous silicon and a hardmask; etching the spacer between the plurality of NFET stacks and the PFET stacks; growing, epitaxially, undoped silicon on a top surface of the fin structure between the plurality of NFET and PFET stacks; depositing a liner over the undoped silicon and the plurality of NFET and PFET stacks; depositing an optical planarization layer over the liner of the NFET fin structure; depositing a SiARC layer over the optical planarization layer; etching to remove the SiARC layer over the NFET fin structure and the liner over the PFET fin structure, narrowing the PFET spacers, wherein the etching forms a wider portion of the spacer at the base of the PFET stacks than the top of the PFET stacks; etching between the plurality of PFET stacks to remove the undoped silicon and form recesses in the fin structure; stripping the optical planarization layer; growing, epitaxially, p-doped silicon between the plurality of PFET stacks and in the fin structure of the PFET fin structure; removing the liner over the NFET fin structure; depositing a liner over the undoped silicon of the NFET fin structure, the plurality of NFET stacks, the plurality of PFET stacks, and the p-doped silicon of the PFET fin structure; depositing an optical planarization layer over the liner of the PFET fin structure; depositing a SiARC layer over the optical planarization layer; etching to remove the SiARC layer over the PFET fin structure and the liner over the NFET fin structure, narrowing the spacers over the NFET fin structure, wherein the etching forms a wider portion of the spacer at the base of the NFET stacks than the top of the NFET stacks; etching between the plurality of NFET stacks to remove the undoped silicon and form recesses in the fin structure; stripping the optical planarization layer; growing, epitaxially, n-doped silicon between the plurality of NFET stacks and in the fin structure of the NFET fin structure; removing the liner over the PFET fin structure.

In another aspect, an intermediate device is provided which includes, for instance: a substrate; a fin structure; a plurality of stacks on the fin structure, wherein the stacks include a layer of amorphous silicon, and a hardmask; a liner covering a portion of the sides of the stacks, wherein the liner is wider at a base of the stacks than at the top of the stacks; and a doped silicon material between the stacks and extending below a top surface of the fin structure.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with improved source and drain epitaxial (epi) growth in fin structures.

Figure 1:
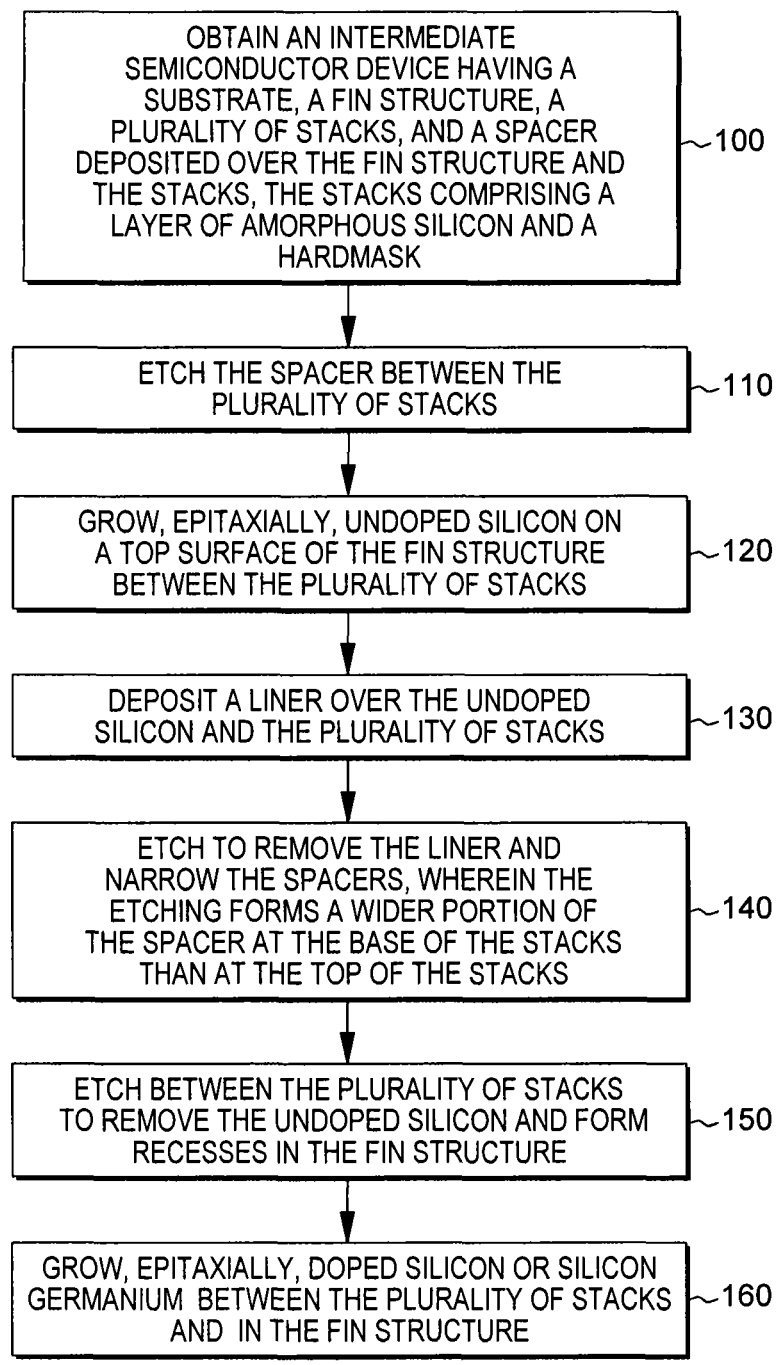
FIG. 1 depicts one embodiment of a method for forming an intermediate semiconductor structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor interconnect device having a substrate, a fin structure, a plurality of stacks, and a spacer deposited over the fin structure and the stacks, the stacks including a layer of amorphous silicon and a hardmask 100; etching the spacer between the plurality of stacks 110; growing, epitaxially, undoped silicon on a top surface of the fin structure between the plurality of stacks 120; depositing a liner over the undoped silicon and the plurality of stacks 130; etching to remove the liner and narrow the spacers, wherein the etching forms a wider portion of the spacer at the base of the stacks than at the top of the stacks 140; etching between the plurality of stacks to remove the undoped silicon and form recesses in the fin structure 150; and growing, epitaxially, doped silicon between the plurality of stack and in the fin structure 160.

FIGS. 2-8 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
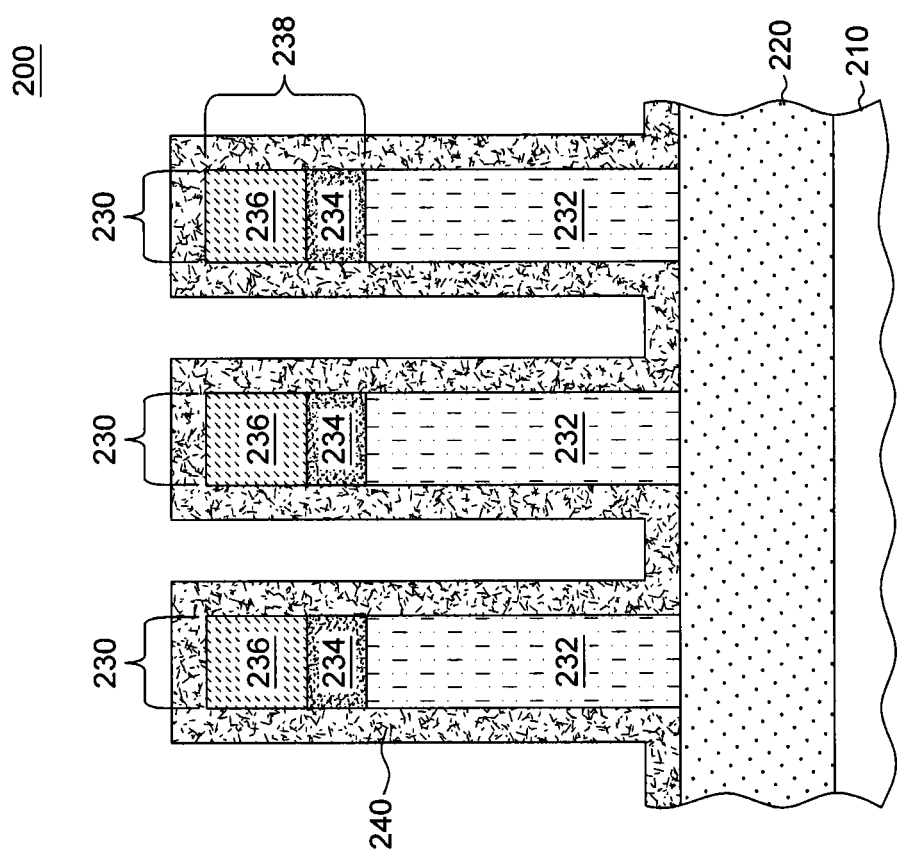
FIG. 2 depicts a cross-sectional elevation view of one embodiment of an intermediate semiconductor structure having a substrate, a fin structure, a plurality of stacks, and a spacer deposited over the fin structure and the stacks, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, a finFET or similar multigate device may be in this state following reactive ion etching (ME) of a dummy gate structure and following spacer deposition. The device 200 may include, for instance, a substrate 210 with a fin structure 220, which may include a silicon containing material or a silicon on insulator (SOI) type material, disposed on the substrate 210. The substrate 210 may be any suitable material, for example, silicon. A plurality of stacks 230 may be disposed on the fin structure 220. The plurality of stacks 230 can act, for instance, as gates for the device 200. In some embodiments, these gates are "dummy" gates, in that they may be removed and replaced with metal gates in a replacement gate integration. As such, each stack 230 may include a variety of materials, including but not limited to an amorphous silicon layer 232 and a hardmask 238. The hardmask 238 may be a single layer or multiple layers. For instance, in some embodiments, hardmask 238 is made up of a nitride hardmask 234 and an oxide hardmask 236. There may also be a spacer 240 over the fin structure 220 and the stacks 230. The spacer 240 may include an SiBCN spacer.

In another embodiment (not shown), the substrate of device 200 may be, for example, a silicon on insulator (SOI) substrate (not shown), in which case substrate 210 and fin structure 220 may be a single layer. For example, the SOI substrate may include an isolation layer (not shown), which may be a local buried oxide region (BOX) or any suitable material for electrically isolating transistors, aligned with the gate structure. In some embodiments, the device is a portion of a front end of line (FEOL) portion of an integrated circuit (IC).

Figure 3:
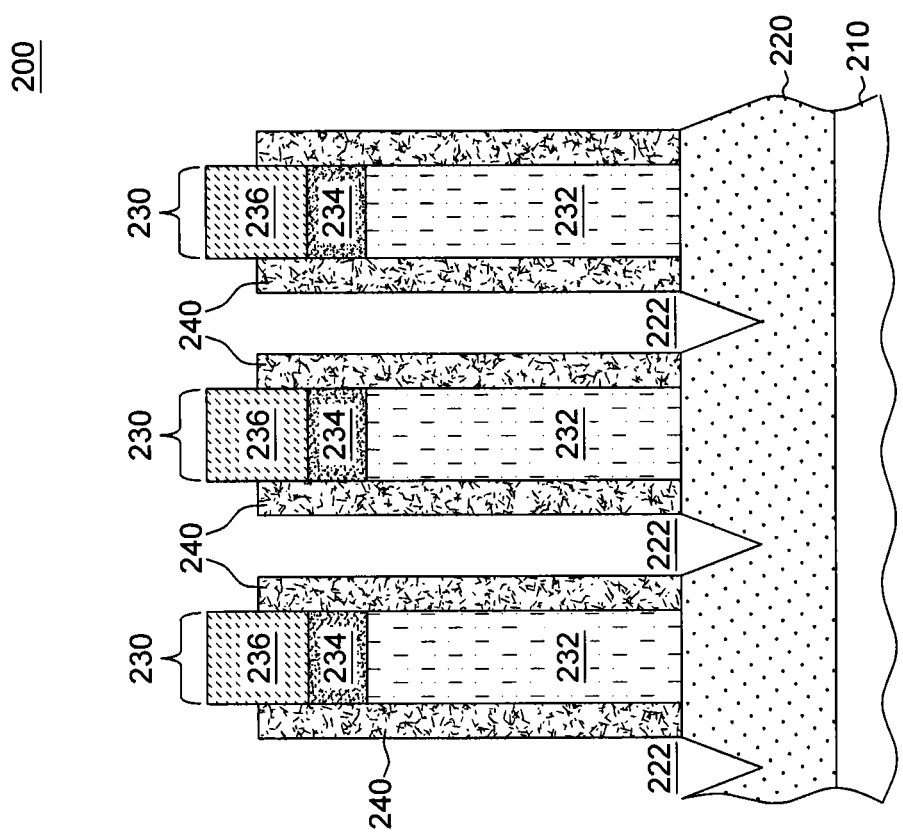
FIG. 3 depicts the structure of FIG. 2 after etching the spacer between the plurality of stacks, in accordance with one or more aspects of the present invention.

As depicted in FIG. 3, using lithography and etching processes, the spacer 240 may be etched to create equal sized spacers 240 around stacks 230. The etching may be performed by any suitable etching process, for example, a directional reactive ion etching (ME). However, due to the size and nature of stacks 230, the ME used it typically quite aggressive and damages the fin structure 220 below in areas 222. This damage and the roughly v-shaped area 222 can cause later materials to become stuck in fin structure 220 and may pinch off stacks 230 later. As can also be seen, etching of spacer 240 between stacks 230 typically causes the spacer 240 over stacks 230 to be removed as well.

Figure 4:
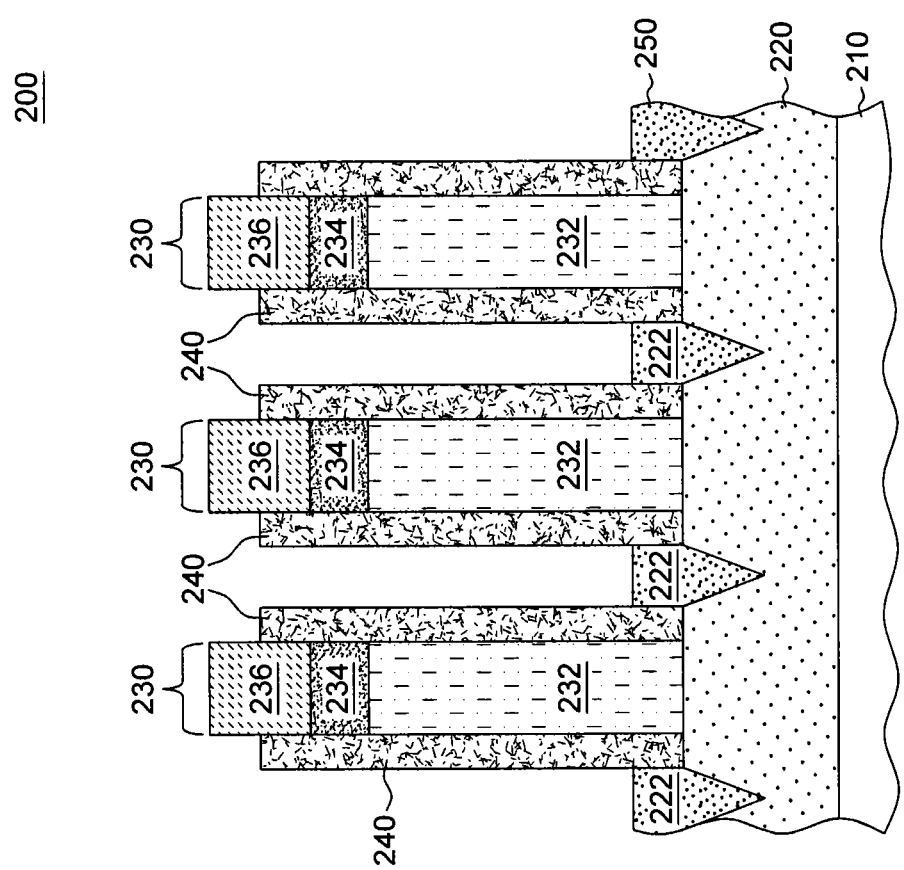
FIG. 4 depicts the structure of FIG. 3 after growing, epitaxially, undoped silicon on a top surface of the fin structure between the plurality of stacks, in accordance with one or more aspects of the present invention.

As depicted in FIG. 4, in order to overcome the problems caused by damaged areas 222, undoped silicon 250 may be grown epitaxially on a top surface of the fin structure 220 between stacks 230. Not only does this repair the v-shaped damage, but as can be seen in FIG. 4, the undoped silicon 250 can be deposited higher than the damage, anchoring the base of spacer 240 and preventing damage in subsequent etching processes. Although undoped silicon 250 is sacrificial, as it will be removed later, used in this manner it can allow for the base of spacer 240 to remain unchanged through further processing.

Figure 5:
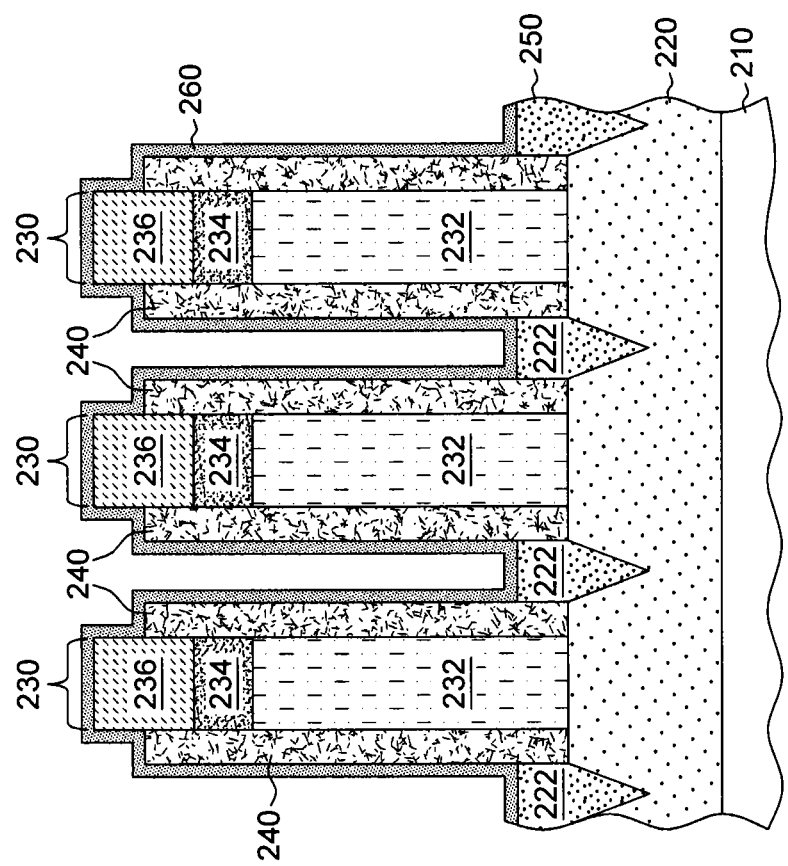
FIG. 5 depicts the structure of FIG. 4 after depositing a liner over the undoped silicon and the plurality of stacks, in accordance with one or more aspects of the present invention.

As depicted in FIG. 5, a liner 260 may be deposited along a top surface of the device 200 by atomic layer deposition (ALD), chemical vapor deposition (CVD), physical vapor deposition (PVD), or any other suitable deposition technique now known or later developed. For instance, the liner 260 may include a nitride, such as SiN. Any deposition capable of forming a consistent thin film or thin layer which can conform to a varied surface, as illustrated in FIG. 5, can be used to deposit the liner 260. The liner 260 may form a layer over the entire top surface of device 200, for instance covering the undoped silicon 250 and all surfaces of stacks 230.

Figure 6:
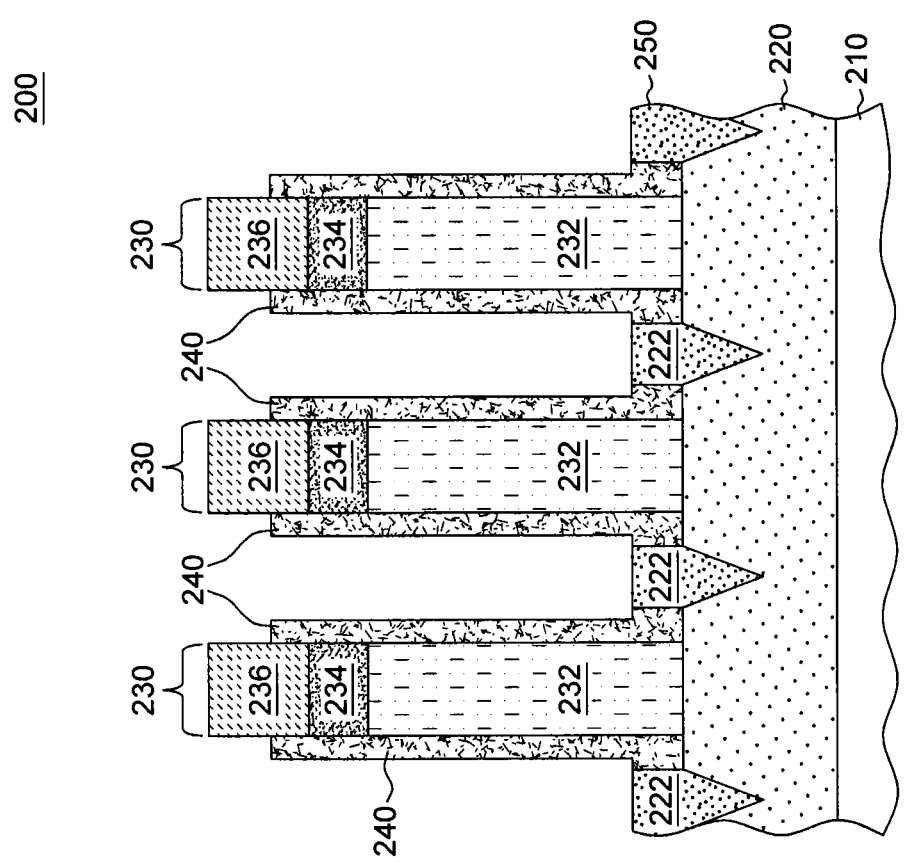
FIG. 6 depicts the structure of FIG. 5 after etching to remove the liner and narrow the spacers at the top of the stacks, while keeping spacer thickness anchored at the base of the stacks, in accordance with one or more aspects of the present invention.

As depicted in FIG. 6, the liner 260 may be etched and removed by wet or dry etching. In some embodiments, the liner is removed using an etching process including exposure to hydrofluoric acid diluted with ethylene glycol (HFEG). Etching of liner 260 may also damage spacer 240, narrowing the spacers between stacks 230. This narrowing of spacer 240 further prevents possible pinch off, and advantageously leaves undoped silicon 250 and spacer 240 material below undoped silicon 250 intact. This forms a unique structure wherein the base of stacks 230 with spacer 240 are wider than the tops of stacks 230 and spacers 240. This new structure allows for a better connection and more structurally sound device.

Figure 7:
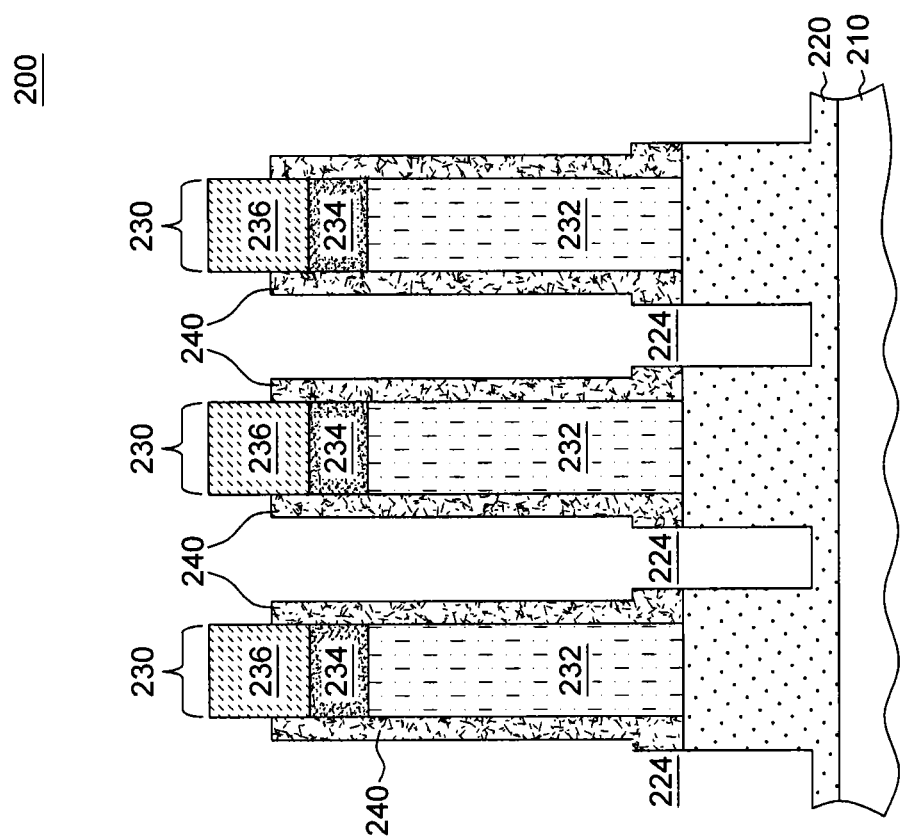
FIG. 7 depicts the structure of FIG. 6 after etching between the plurality of stacks to remove the undoped silicon and form recesses in the fin structure, in accordance with one or more aspects of the present invention.

As depicted in FIG. 7, recesses 224 may be formed in fin structure 220 between stacks 230 by etching the undoped silicon. The widened base of stacks 230 is maintained during this etching. This silicon etch can remove substantially only the undoped silicon 250 and material of the fin structure 220 directly below.

Figure 8:
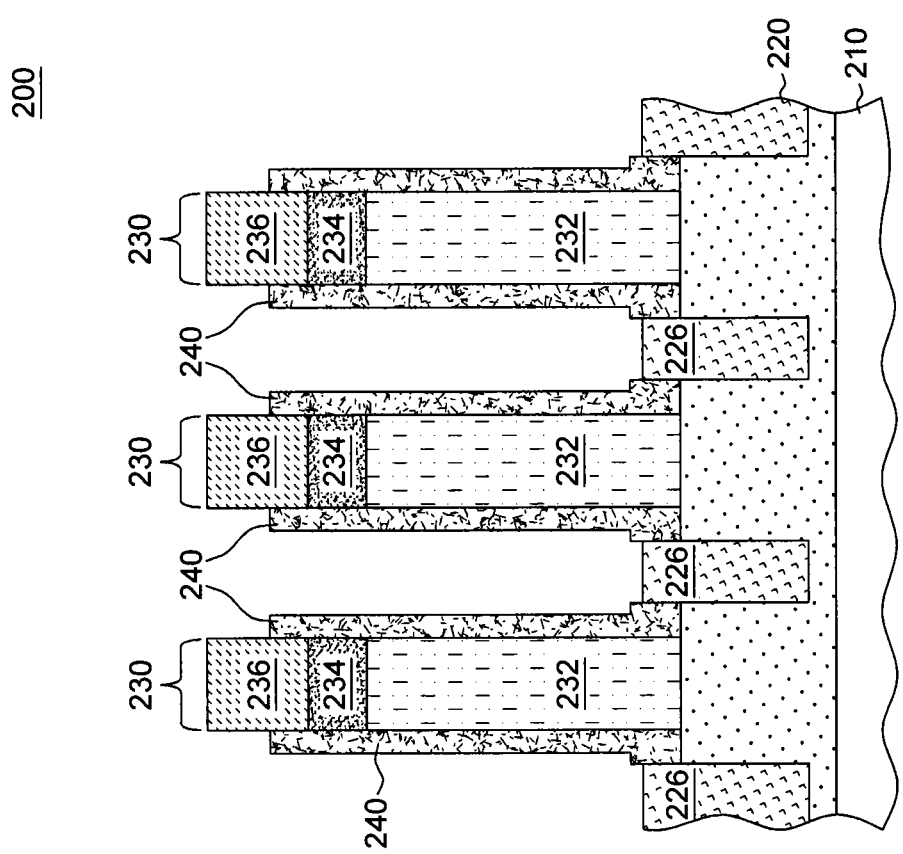
FIG. 8 depicts the structure of FIG. 7 after growing, epitaxially, doped silicon between the plurality of stacks, in accordance with one or more aspects of the present invention.

As depicted in FIG. 8, recesses 224 may be filled by epitaxial growth of a doped silicon between the stacks 230 in fin structure 220. The doped silicon may include n-doped silicon or p-doped silicon, depending on the end use of device 200. The result is clean fin structures with evenly layered spacers, with stacks 230 having wider bases for more efficient anchoring to doped silicon 226.

FIGS. 9-21 depict, by way of example only, a detailed embodiment of a further embodiment of a portion of a semiconductor device formation process and a portion of an intermediate semiconductor interconnect structure, in accordance with one or more aspects of the present invention. Note that these figures are not drawn to scale in order to facilitate understanding of the invention, and that the same reference numerals used throughout different figures designate the same or similar elements.

Figure 9:
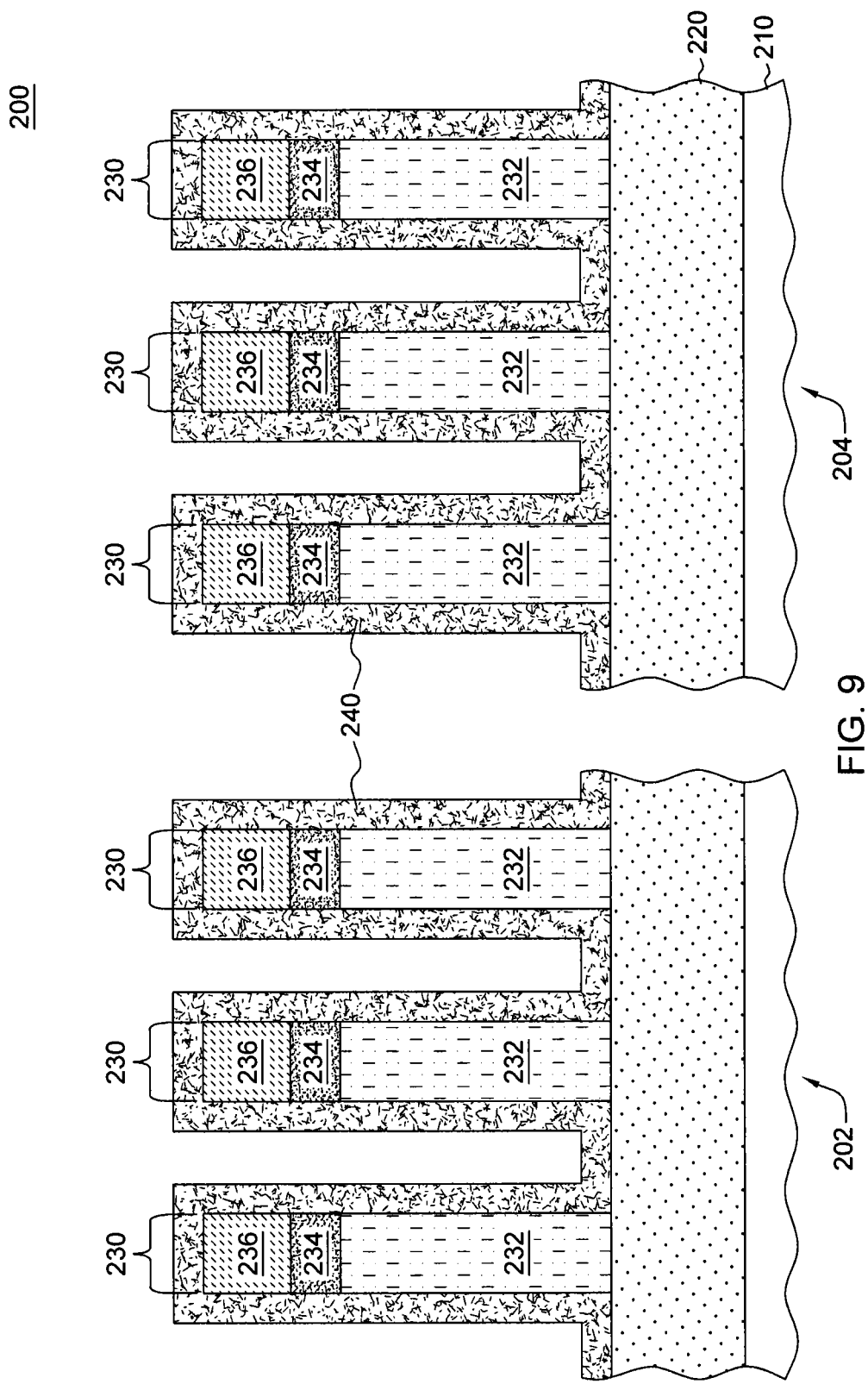
FIG. 9 depicts a cross-sectional elevation view of one embodiment of an intermediate semiconductor structure having a substrate, an NFET fin structure and a PFET fin structure, each having a plurality of stacks, and a spacer deposited over the fin structure and the stacks, in accordance with one or more aspects of the present invention.

FIG. 9 shows a portion of an intermediate semiconductor device generally denoted 200, depicted at an intermediate semiconductor fabrication stage. The device 200 may have been processed through initial device processing steps in accordance with the design of the device 200 being fabricated. For example, a finFET or similar multigate device may be in this state following reactive ion etching (ME) of a gates hardmask and following spacer deposition. The device 200 may include, for instance, a substrate 210, which may be continuous between an NFET fin structure 220 on NFET side 202 and a PFET fin structure 220 on a PFET side 204. While illustrated as an NFET side 202 and a PFET side 204 with a space between, it should be understood that either device can be on either side and may be at any distance from one another. Like numerals are used throughout as the materials used on either side are interchangeable until doping occurs. Additionally, any of the methods or materials described above in reference to a single fin structure 220 may be applied similarly to the description of two fins structures 230 herein, and descriptions will be left out where unnecessary.

Still referring to FIG. 9, substrate 210 may include a silicon containing material or a silicon on insulator (SOI) type material, disposed on the substrate 210. The substrate 210 may be any suitable material, for example, silicon. A plurality of stacks 230 may be disposed on each fin structure 220. Additionally, fin structures 220 may be a continuous material. Each stack 230 may include a variety of materials, including but not limited to an amorphous silicon layer 232 and a hardmask 238. The hardmask 238 may be a single layer or multiple layers. For instance, in some embodiments, hardmask 238 is made up of a nitride hardmask 234 and an oxide hardmask 236. There may also be a spacer 240 over the fin structure 220 and the stacks 230. The spacer 240 may include materials such as SiBCN, SiOCN, SiOC, and others, in which the spacer material must have selectivity relative to the liner.

Figure 10:
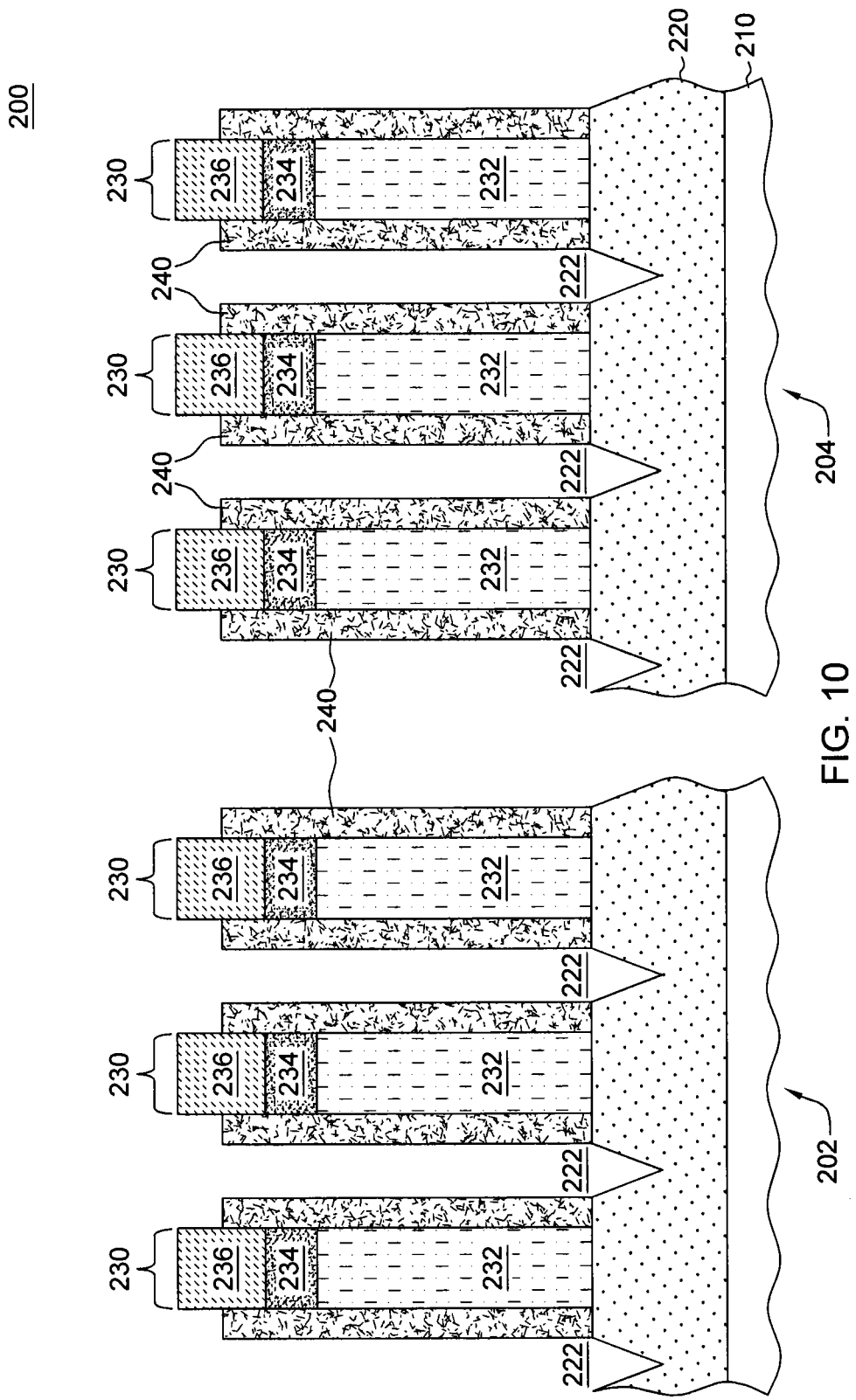
FIG. 10 depicts the structure of FIG. 9 after etching the spacer between the plurality of stacks, in accordance with one or more aspects of the present invention.

As depicted in FIG. 10, using lithography and etching processes, the spacer 240 may be etched to create equal sized spacers 240 around stacks 230 on the NFET side 202 and the PFET side 204 either separately or simultaneously. The etching may be performed, as above, by any suitable etching process, for example, a directional reactive ion etching (ME). However, due to the size and nature of stacks 230, the RIE used it typically quite aggressive and damages the fin structure 220 below in areas 222. This damage and the roughly v-shaped area 222 can cause later materials to become stuck in fin structure 220 and may pinch off stacks 230 later. As can also be seen, etching of spacer 240 between stacks 230 typically causes the spacer 240 over stacks 230 to be removed as well.

Figure 11:
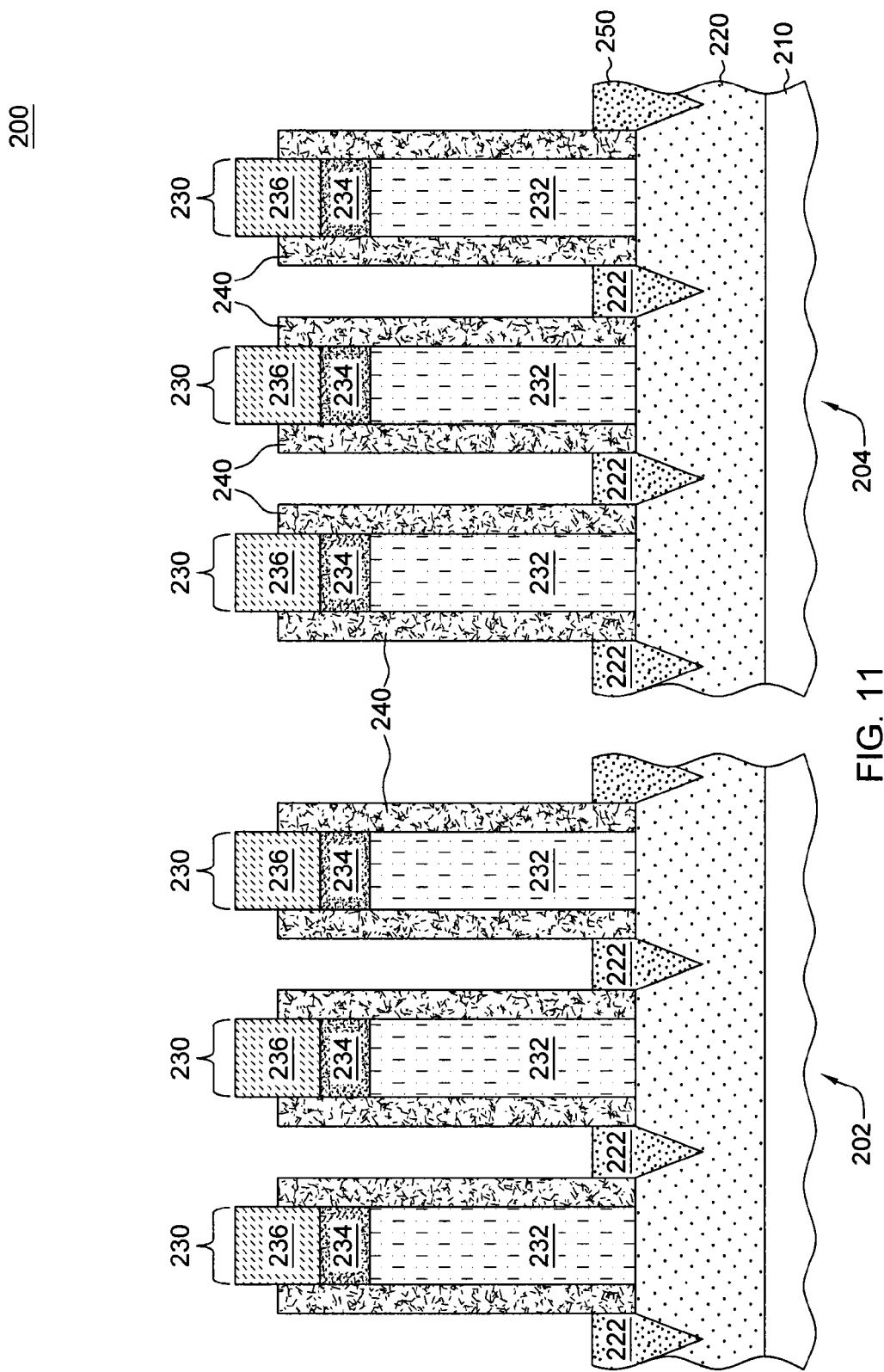
FIG. 11 depicts the structure of FIG. 10 after growing, epitaxially, undoped silicon on a top surface of the fin structure between the plurality of stacks, in accordance with one or more aspects of the present invention.

As depicted in FIG. 11, in order to overcome the problems caused by damaged areas 222, undoped silicon 250 may be grown epitaxially on a top surface of the fin structure 220 between stacks 230 on the NFET side 202 and the PFET side 204 either separately or simultaneously. Not only does this repair the v-shaped damage, but as can be seen in FIG. 11, the undoped silicon 250 can be deposited higher than the damage, anchoring the base of spacer 240 and preventing damage in subsequent etching processes. Although undoped silicon 250 is sacrificial, as it will be removed later, used in this manner it can allow for the base of spacer 240 to remain unchanged through further processing.

Figure 12:
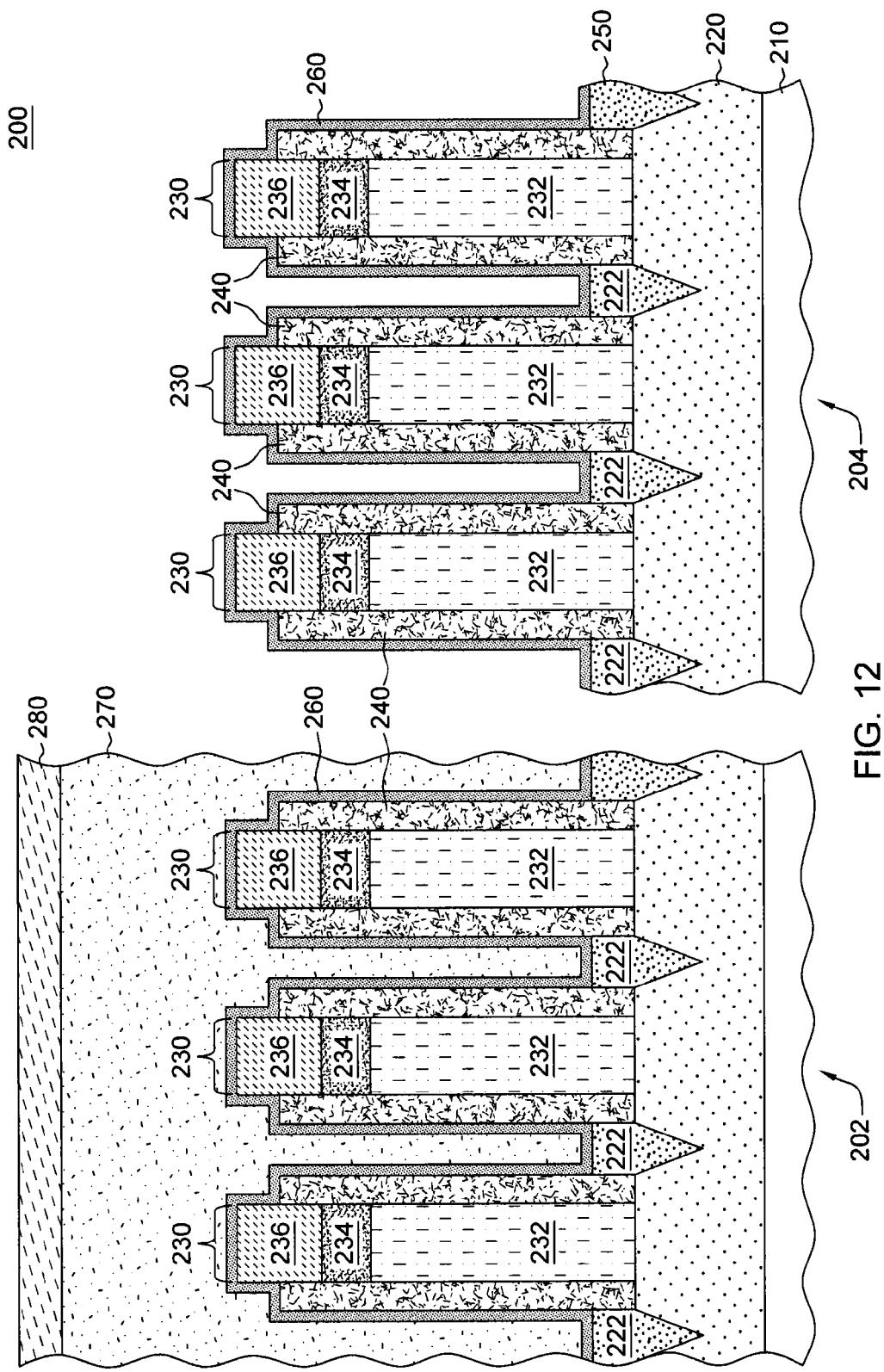
FIG. 12 depicts the structure of FIG. 11 after depositing a liner over the undoped silicon and the plurality of stacks and depositing an optical planarization layer, SiARC layer, and photoresist layers over the liner, followed by photolithography and etch to open the PFET while keeping the NFET fin structure covered, in accordance with one or more aspects of the present invention.

As depicted in FIG. 12, a liner 260 may be deposited along a top surface of the device 200 on the NFET side 202 and the PFET side 204 either separately or simultaneously, by atomic layer deposition (ALD), chemical vapor deposition (CVD), physical vapor deposition (PVD), or any other suitable deposition technique now known or later developed. For instance, the liner 260 may include SiN. Any deposition capable of forming a consistent thin film or thin layer which can conform to a varied surface, as illustrated in FIG. 5, can be used to deposit the liner 260. The liner 260 may form a layer over the entire top surface of device 200, for instance covering the undoped silicon 250 and all surfaces of stacks 230.

As also depicted in FIG. 12, an optical planarization layer (OPL) 270 may be deposited over the liner 260 of the NFET side 202 in order to mask the NFET side 202 during processing of the PFET side 204. Following deposition of the OPL 270, a silicon containing anti-reflective coating (SiARC) layer 280 may be deposited over the OPL 270. While described as an SiARC layer, it should be understood that any SiARC materials or low temperature oxides (LTO) may be used for SiARC layers 280. In some embodiments, the OPL 270, SiARC layer 280, and photoresist layers (not shown) are deposited over both the NFET side 202 and the PFET side 204, and then photolithography and etched to open the PFET side 204 while keeping the NFET side 202 covered.

Figure 13:
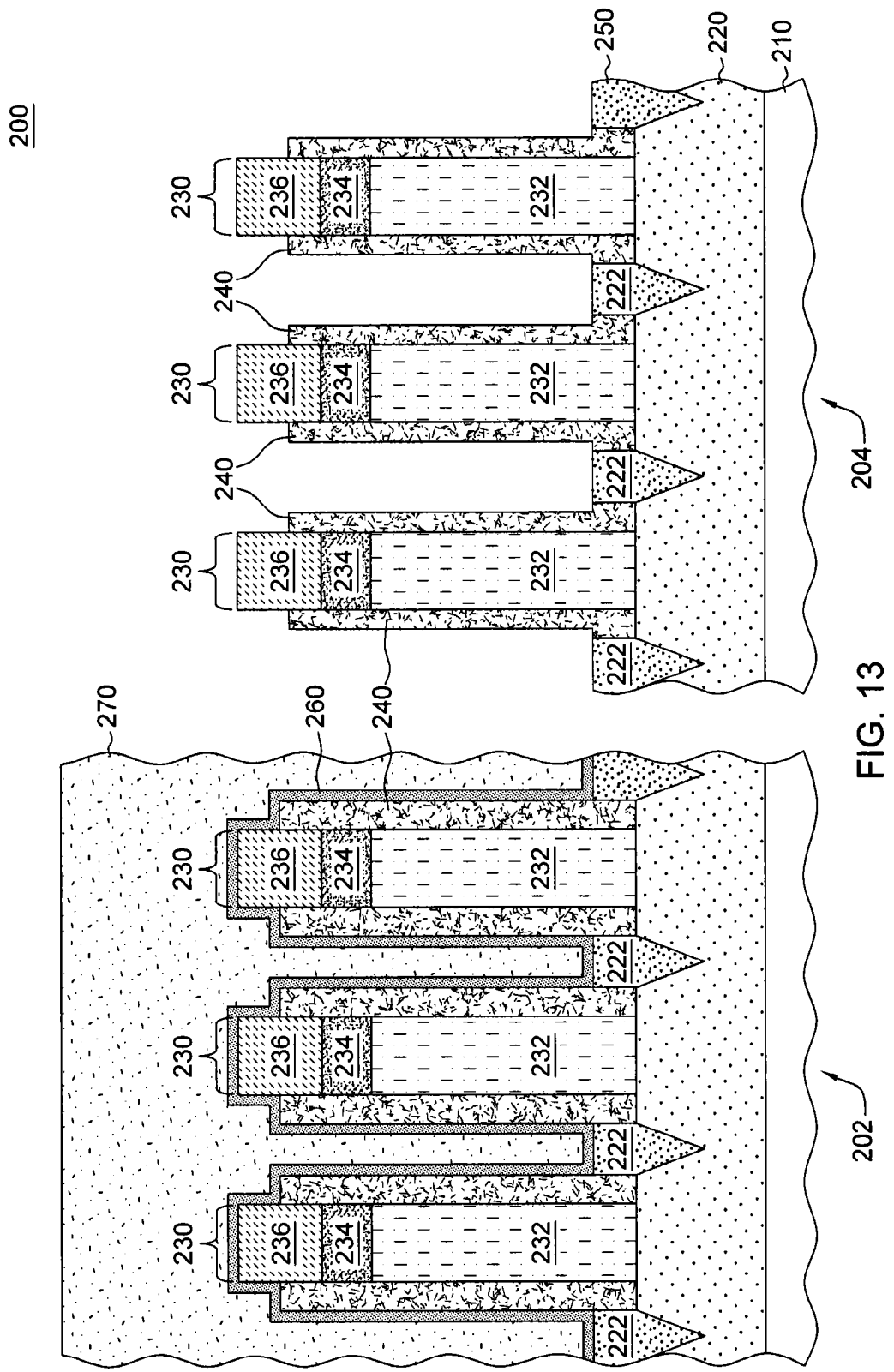
FIG. 13 depicts the structure of FIG. 12 after etching to remove the liner and narrow the spacers of the PFET fin structure at the top of the stacks, while keeping spacer thickness anchored at the base of the stacks, in accordance with one or more aspects of the present invention.

As depicted in FIG. 13, the liner 260 on the PFET side 204 may be etched and removed by wet or dry etching. In some embodiments, the liner is removed using an etching process including exposure to hydrofluoric acid diluted with ethylene glycol (HFEG). Etching of liner 260 may also damage spacer 240, narrowing the spacers between stacks 230. This narrowing of spacer 240 further prevents possible pinch off, and advantageously leaves undoped silicon 250 and spacer 240 material below undoped silicon 250 intact. This forms a unique structure wherein the base of stacks 230 with spacer 240 are wider than the tops of stacks 230 and spacers 240. This new structure allows for a better connection and more structurally sound device. During removal of liner 260 on PFET side 204, SiARC layer 280 of NFET side 202 is also removed.

Figure 14:
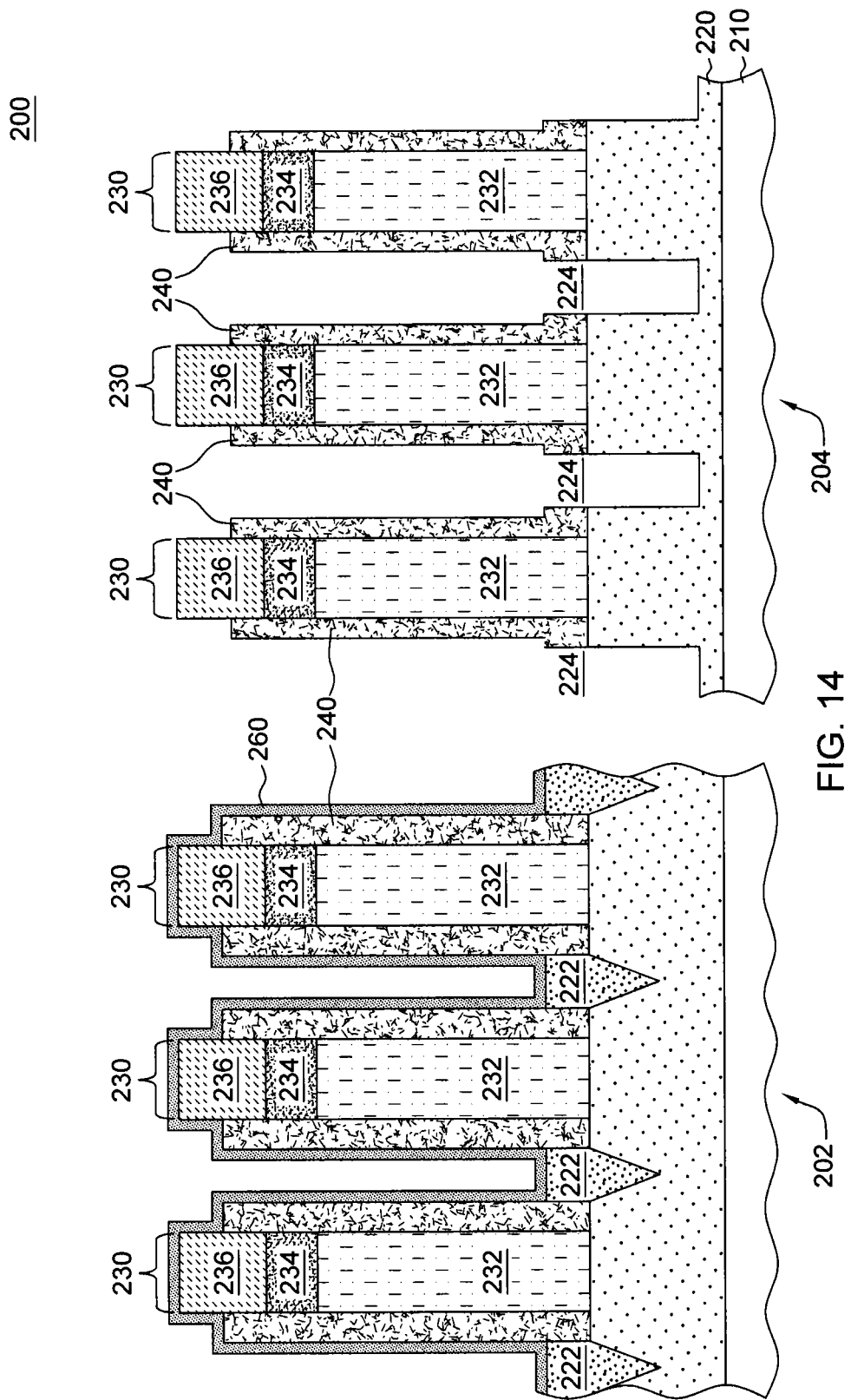
FIG. 14 depicts the structure of FIG. 13 after etching between the plurality of stacks to remove the undoped silicon and form recesses in the PFET fin structure, in accordance with one or more aspects of the present invention.

As depicted in FIG. 14, recesses 224 may be formed in fin structure 220 between stacks 230 by etching the undoped silicon on the PFET side 204. The widened base of stacks 230 is maintained during this etching. This silicon etch can remove substantially only the undoped silicon 250 and material of the fin structure 220 directly below. Additionally, the OPL 270 is removed, or stripped, during this process on the NFET side 202.

Figure 15:
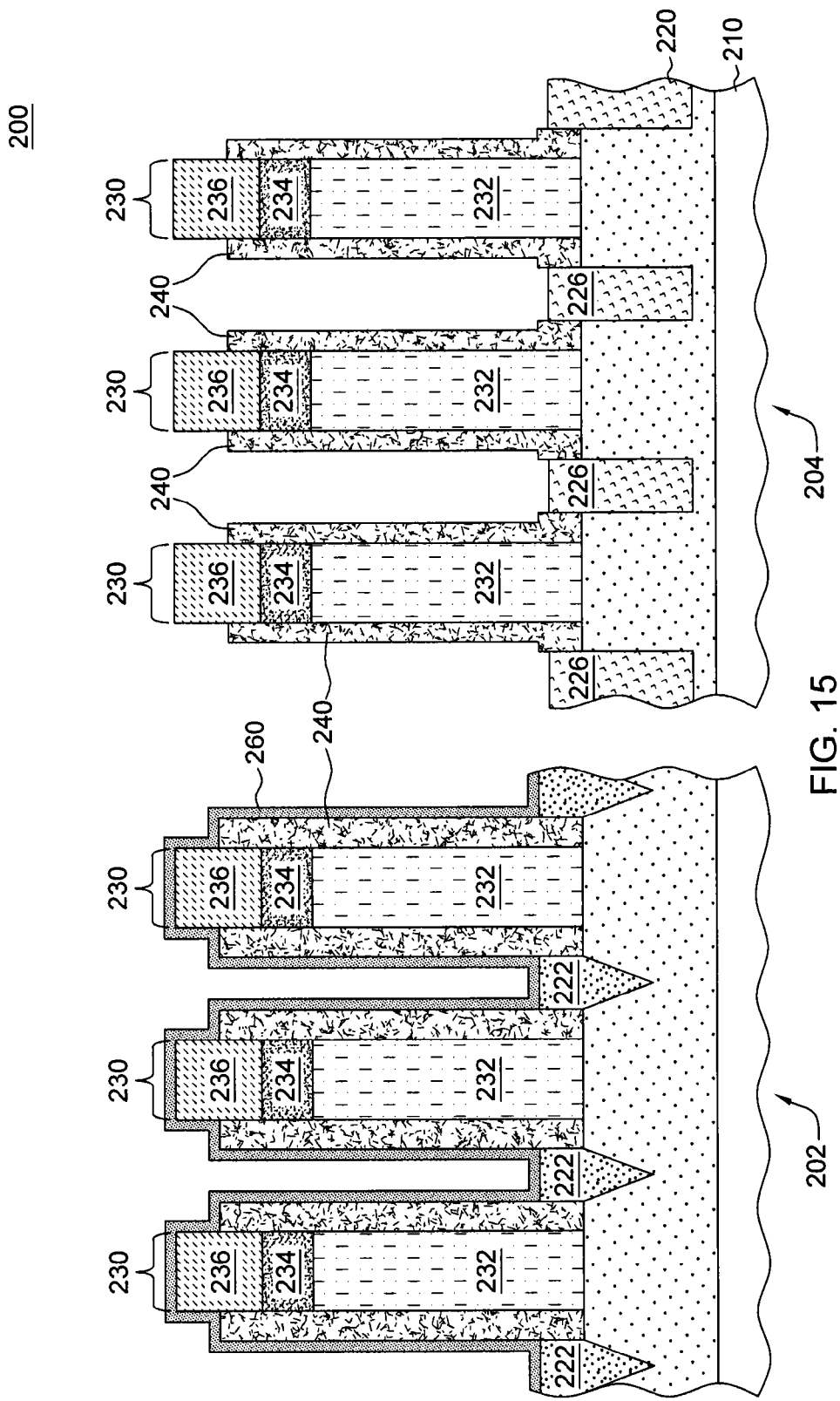
FIG. 15 depicts the structure of FIG. 14 after growing, epitaxially, doped silicon germanium between the plurality of stacks in the PFET fin structure, in accordance with one or more aspects of the present invention.

As depicted in FIG. 15, recesses 224 on PFET side 204 may be filled by epitaxial growth of a doped silicon germanium between the stacks 230 in fin structure 220. The doped silicon may be p-doped silicon, making this the PFET side 204 of device 200.

Figure 16:
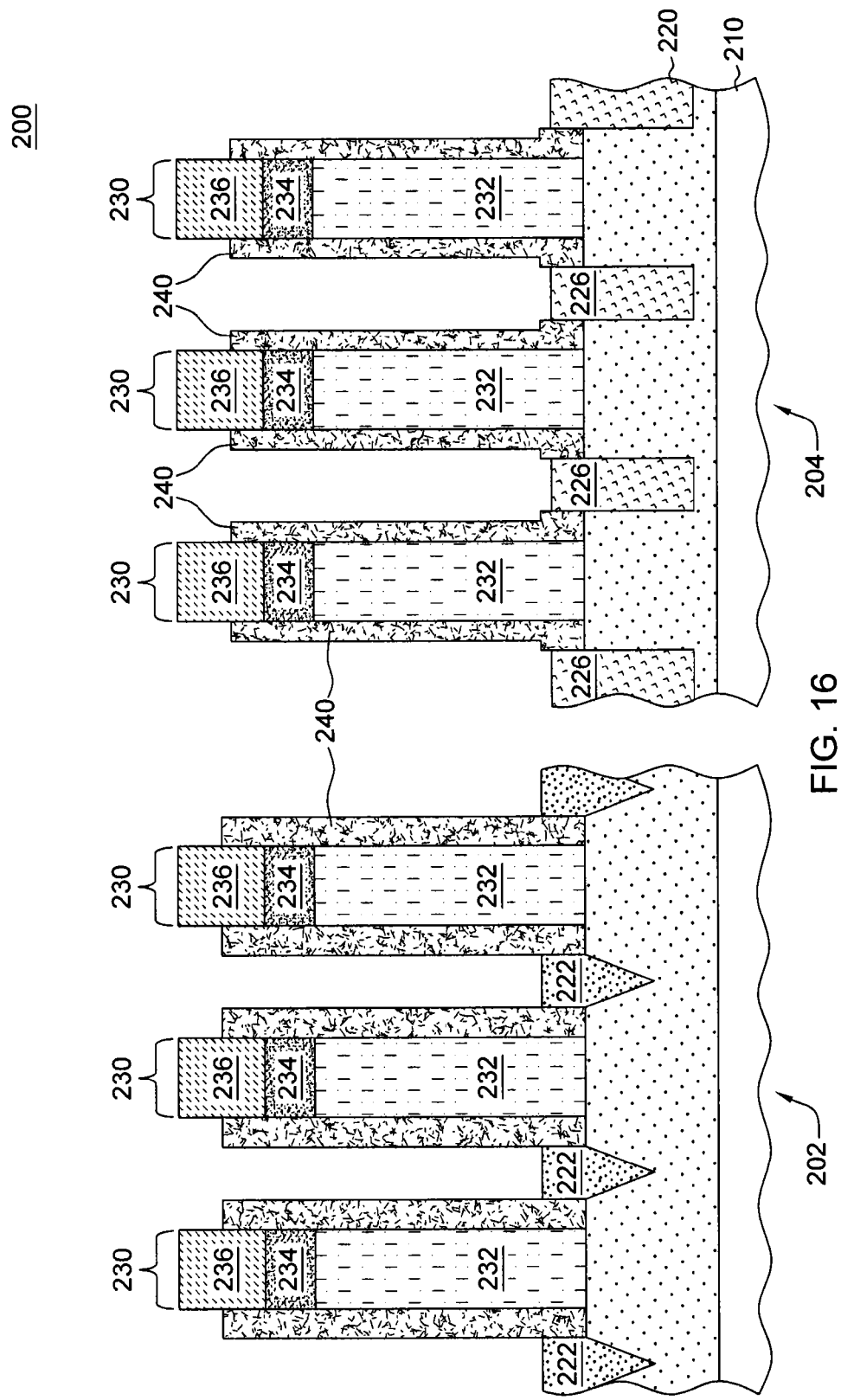
FIG. 16 depicts the structure of FIG. 15 after removing the liner over the NFET fin structure, in accordance with one or more aspects of the present invention.

As depicted in FIG. 16, the remaining liner 260 over the NFET side 202 may be removed by etching. For example, etching may be achieved by exposure to HFEG or other commonly used wet or dry etches. Processing of NFET side 202 of device 200 can now commence. It should be understood though, that PFET side 204 is processed first only as an example and is not intended to be limiting. These processes should be understood to be capable of being carried out in any order.

Figure 17:
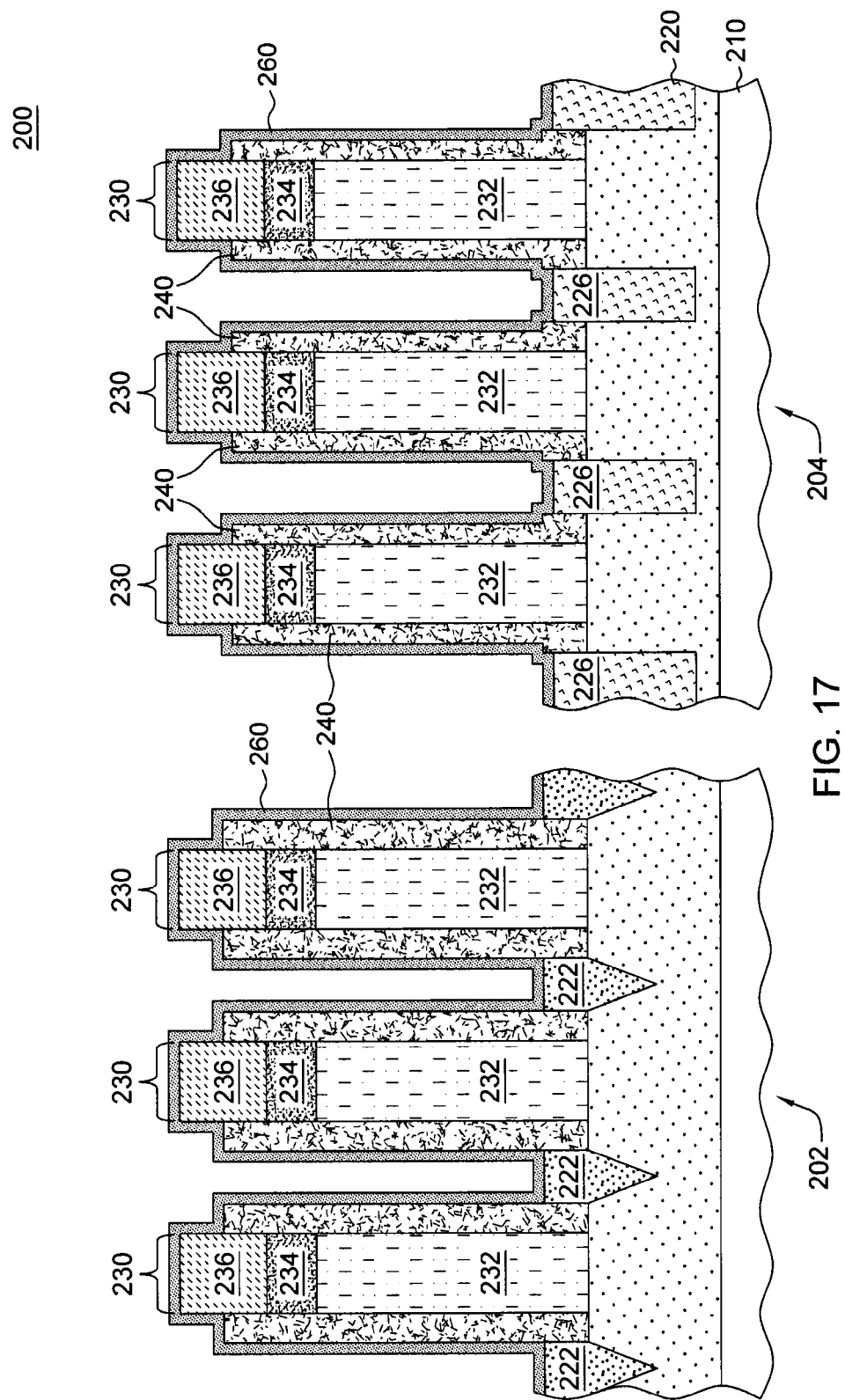
FIG. 17 depicts the structure of FIG. 16 after depositing a liner over the undoped silicon and the plurality of stacks.

As depicted in FIG. 17, a liner 260 is deposited as described above. This liner can be of the same material and method of any other description of liner 260 previously described. In these embodiments, liner 260 is applied over the undoped silicon 250 remaining on NFET side 202, and over the stacks 230. The liner 260 is also deposited over the PFET side 204, covering the p-doped silicon 226 and stacks 230. In some embodiments, the liner 260 deposition can result in slight loss of spacer 240.

Figure 18:
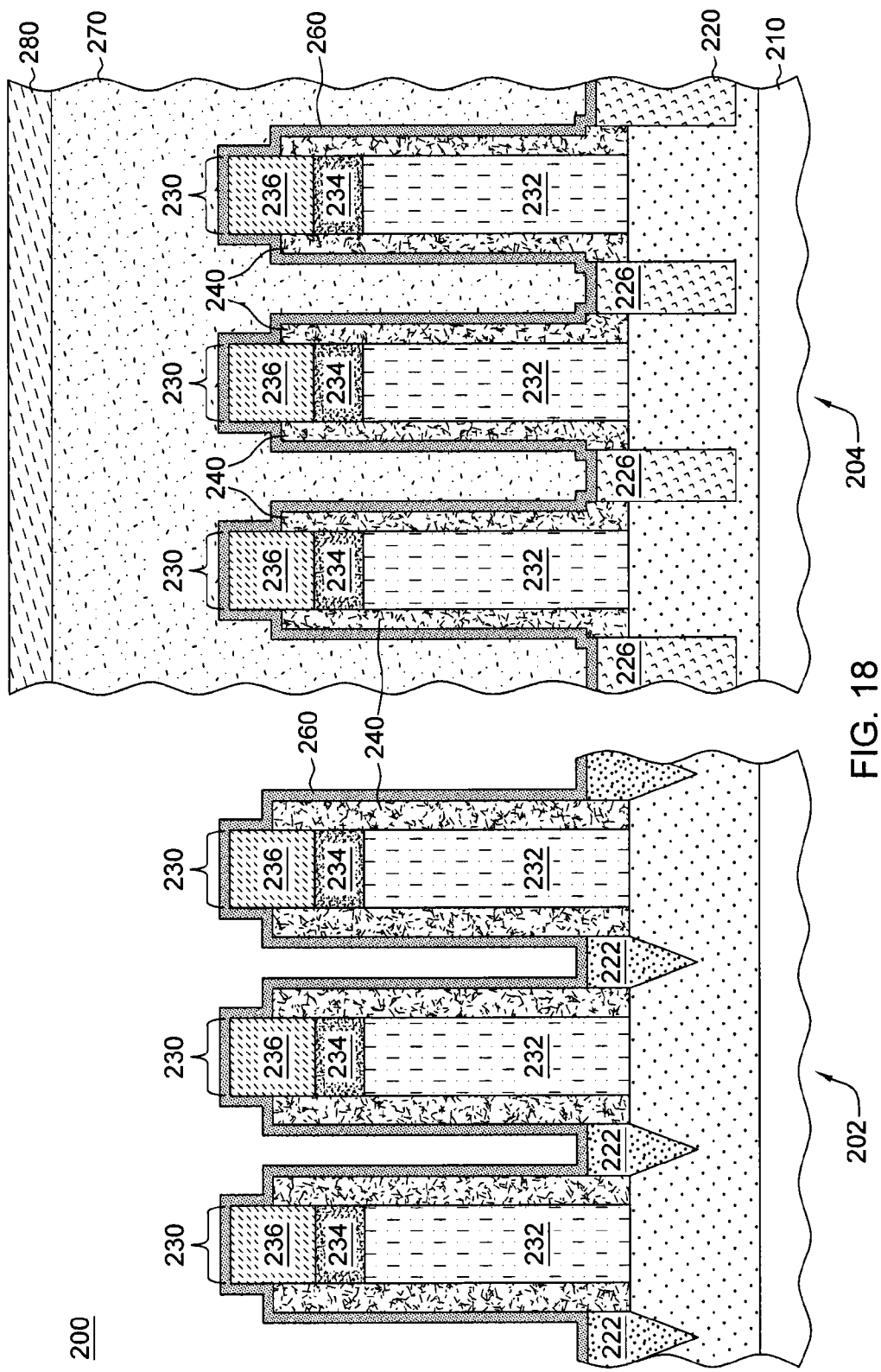
FIG. 18 depicts the structure of FIG. 17 after depositing an optical planarization layer, SiARC layer, and photoresist layers over the liner, followed by lithography and etch to open the NFET while keeping the PFET fin structure covered, in accordance with one or more aspects of the present invention.

As depicted in FIG. 18, an optical planarization layer (OPL) 270 may be deposited over the liner 260 of the PFET side 204 in order to mask the PFET side 204 during processing of the NFET side 202. Following deposition of the OPL 270, an SiARC layer 280 may be deposited over the OPL 270. In some embodiments, the OPL 270, SiARC layer 280, and photoresist layers (not shown) are deposited over both the NFET side 202 and the PFET side 204, and then photolithography and etched to open the NFET side 202 while keeping the PFET side 204 covered.

Figure 19:
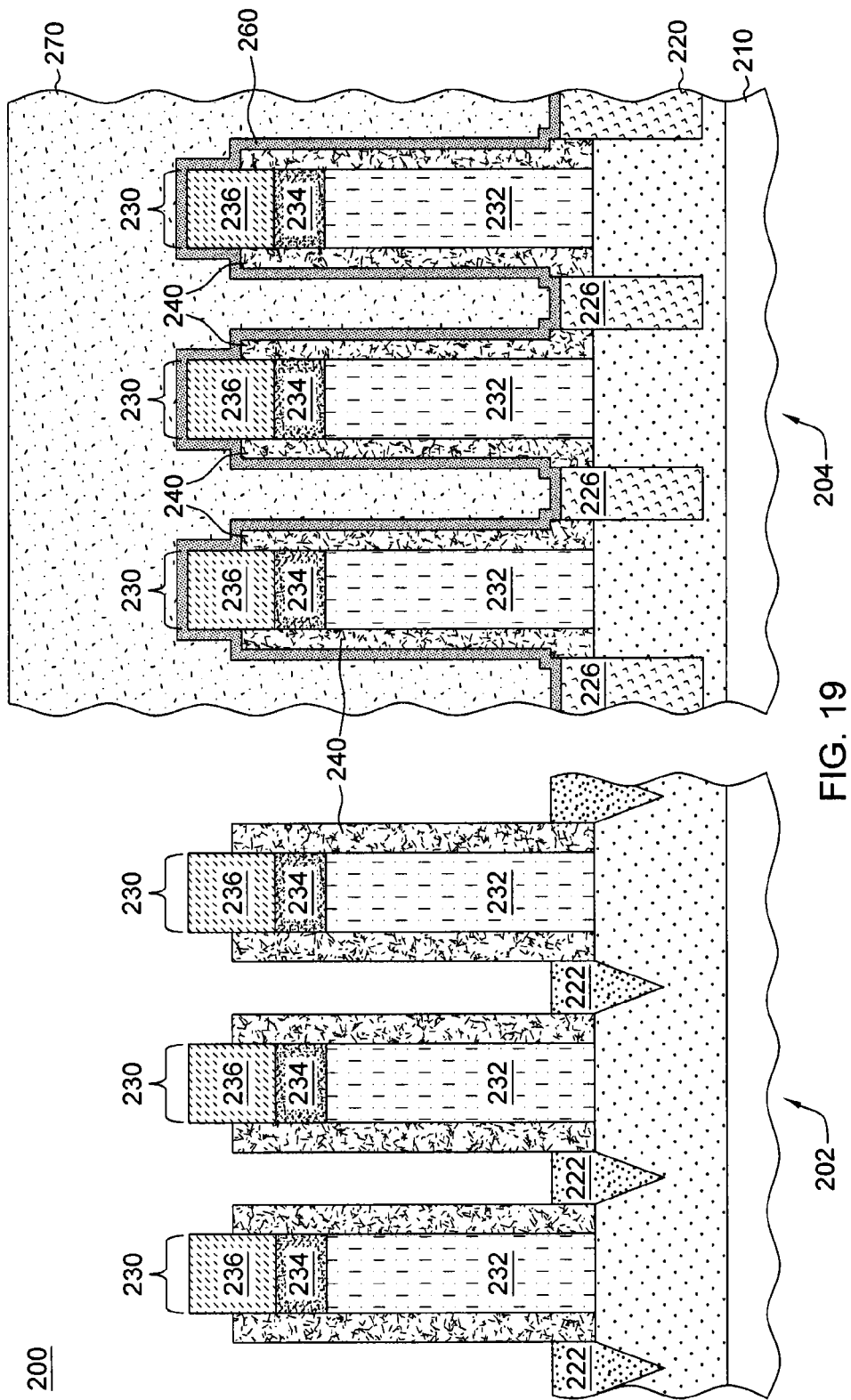
FIG. 19 depicts the structure of FIG. 18 after etching to remove the liner and narrow the spacers of the NFET fin structure at the top of the stacks, while keeping spacer thickness anchored at the base of the stacks, in accordance with one or more aspects of the present invention.

As depicted in FIG. 19, the liner 260 on the NFET side 202 may be etched and removed by wet or dry etching. In some embodiments, the liner is removed using an etching process including exposure to hydrofluoric acid diluted with ethylene glycol (HFEG). Etching of liner 260 may also damage spacer 240, narrowing the spacers between stacks 230. This narrowing of spacer 240 further prevents possible pinch off, and advantageously leaves undoped silicon 250 and spacer 240 material below undoped silicon 250 intact. This forms a unique structure wherein the base of stacks 230 with spacer 240 are wider than the tops of stacks 230 and spacers 240. This new structure allows for a better connection and more structurally sound device. During removal of liner 260 on NFET side 202, SiARC layer 280 of PFET side 204 is also removed.

Figure 20:
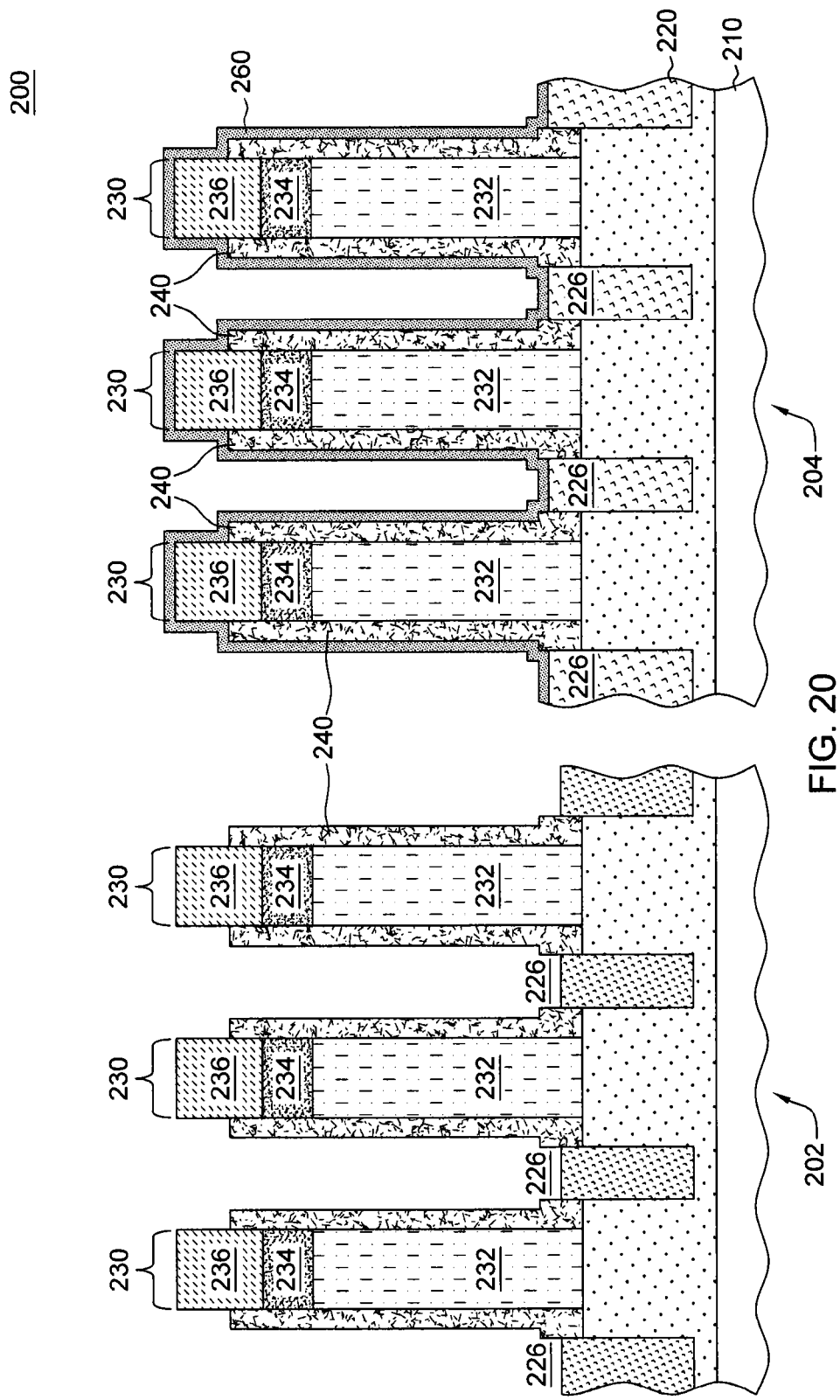
FIG. 20 depicts the structure of FIG. 19 after etching between the plurality of stacks to remove the undoped silicon and form recesses in the NFET fin structure and growing, epitaxially, doped silicon between the plurality of stacks in the NFET fin structure, in accordance with one or more aspects of the present invention.
Figure 21:
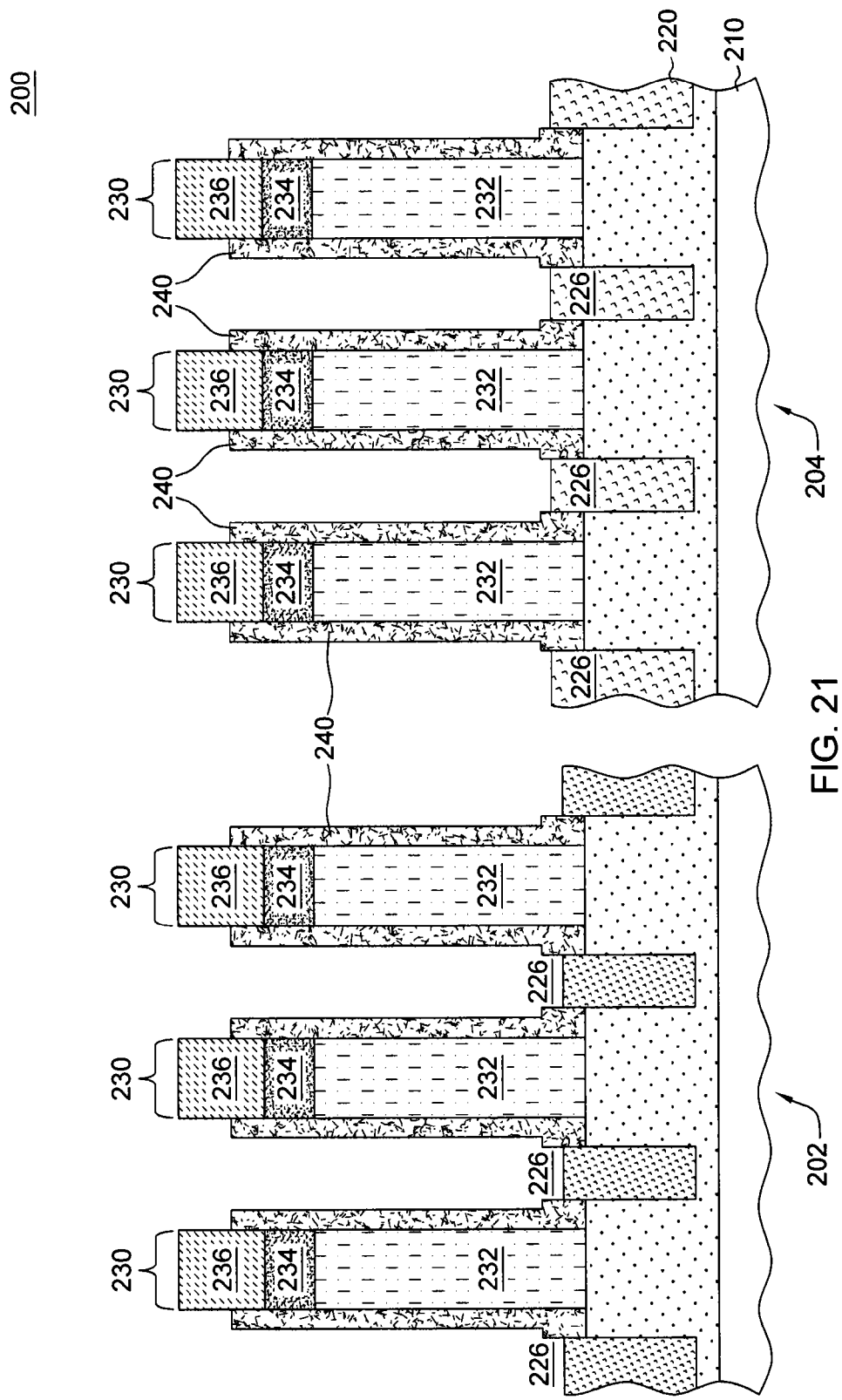
FIG. 21 depicts the structure of FIG. 20 after removing the liner over the PFET fin structure, in accordance with one or more aspects of the present invention.

As depicted in FIG. 20, recesses 224 (not shown) may be formed in fin structure 220 between stacks 230 by etching the undoped silicon on the NFET side 202. The widened base of stacks 230 is maintained during this etching. This silicon etch can remove substantially only the undoped silicon 250 and material of the fin structure 220 directly below. Additionally, the OPL 270 is removed, or stripped, during this process on the NFET side 202.

As also depicted in FIG. 20, recesses 224 on NFET side 202 may be filled by epitaxial growth of a doped silicon between the stacks 230 in fin structure 220. The doped silicon may be n-doped silicon, making this the NFET side 202 of device 200.

As depicted in FIG. 20, the remaining liner 260 over the PFET side 204 may be removed by etching. For example, etching may be achieved by exposure to HFEG or other commonly used wet or dry etches. Again, the result of this process is a clean set of fin structures with evenly layered spacers, with stacks 230 having wider bases for more efficient anchoring to doped silicon 226 on NFET side 202 and PFET side 204. The shape of stacks 230 and liners 240 creates an advantage structurally and electrically.

It should be appreciated that the novel intermediate semiconductor devices and methods of forming the same disclosed above alleviate issues caused by the damage of aggressive RIE processes used to even space fin structures. According to embodiments, the use of a sacrificial silicon fill in damaged areas can allow for damage repair from ME and can alter the end shape of stacks on the fins, creating a more anchored structure. Pinch off from fin damage or other materials, including but not limited to OPL, residue from ME, and residual liner material can be avoided. According to some embodiments, these devices and processes can be useful in the logic area of devices that typically utilize fin recessing and epitaxial growth. However, it should be understood that even devices that don't typically utilize intentional fin recessing can benefit from application of the above methods. The embodiments described herein can be utilized on any devices which may suffer from fin damage due to spacer ME of any sort.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device having a substrate, a fin structure, a plurality of stacks, and a spacer deposited over the fin structure and the stacks, the stacks comprising a layer of amorphous silicon and a hardmask;
    etching the spacer between the plurality of stacks;
    growing, epitaxially, undoped silicon on a top surface of the fin structure between the plurality of stacks;
    depositing a liner over the undoped silicon and the plurality of stacks;
    etching to remove the liner and narrow the spacers, wherein the etching forms a wider portion of the spacer at the base of the stacks than the top of the stacks;
    etching between the plurality of stacks to remove the undoped silicon and form recesses in the fin structure; and
    growing, epitaxially, doped silicon or doped silicon germanium between the plurality of stacks and in the fin structure.

2. The method of claim 1, wherein the hardmask comprises a nitride hardmask and an oxide hardmask.

3. The method of claim 1, wherein the spacer includes SiBCN, SiOCN, or SiOC.

4. The method of claim 1, wherein the etching to remove the liner comprises one of wet etching or dry etching.

5. The method of claim 1, wherein the etching between the plurality of stacks comprises a silicon etch.

6. The method of claim 1, wherein the doped silicon comprises one of n-doped silicon or p-doped silicon.

7. The method of claim 1, wherein the removing of the liner comprises HFEG exposure.

8. A method comprising:
    obtaining an intermediate semiconductor device having a substrate, an NFET fin structure having a plurality of NFET stacks, and a spacer deposited over the fin structure and the NFET stacks, the NFET stacks comprising a layer of amorphous silicon, a nitride hardmask, and an oxide hardmask; and a PFET fin structure having a plurality of PFET stacks, and a spacer deposited over the fin structure and the PFET stacks, the PFET stacks comprising a layer of amorphous silicon and a hardmask;
    etching the spacer between the plurality of NFET stacks and the PFET stacks;
    growing, epitaxially, undoped silicon on a top surface of the fin structure between the plurality of NFET and PFET stacks;
    depositing a liner over the undoped silicon and the plurality of NFET and PFET stacks;
    depositing an optical planarization layer over the liner of the NFET fin structure;
    depositing a SiARC layer over the optical planarization layer;
    etching to remove the SiARC layer over the NFET fin structure and the liner over the PFET fin structure, narrowing the PFET spacers, wherein the etching forms a wider portion of the spacer at the base of the PFET stacks than the top of the PFET stacks;
    etching between the plurality of PFET stacks to remove the undoped silicon and form recesses in the fin structure;

stripping the optical planarization layer;
growing, epitaxially, p-doped silicon or silicon germanium between the plurality of PFET stacks and in the fin structure of the PFET fin structure;
removing the liner over the NFET fin structure;
depositing a liner over the undoped silicon of the NFET fin structure, the plurality of NFET stacks, the plurality of PFET stacks, and the p-doped silicon of the PFET fin structure;
depositing an optical planarization layer over the liner of the PFET fin structure;
depositing a SiARC layer over the optical planarization layer;
etching to remove the SiARC layer over the PFET fin structure and the liner over the NFET fin structure, narrowing the spacers over the NFET fin structure, wherein the etching forms a wider portion of the spacer at the base of the NFET stacks than the top of the NFET stacks;
etching between the plurality of NFET stacks to remove the undoped silicon and form recesses in the fin structure;
stripping the optical planarization layer;
growing, epitaxially, n-doped silicon or doped silicon between the plurality of NFET stacks and in the fin structure of the NFET fin structure;
removing the liner over the PFET fin structure.

9. The method of claim 8, wherein the hardmask comprises a nitride hardmask and an oxide hardmask.

10. The method of claim 8, wherein the spacer includes SiBCN, SiOCN, or SiOC.

11. The method of claim 8, wherein the etching to remove the liner comprises one of wet etching or dry etching.

12. The method of claim 8, wherein the etching between the plurality of stacks comprises a silicon etch.

13. The method of claim 8, wherein the removing of the liner comprises HFEG exposure.

\* \* \* \* \*